(12) United States Patent
Madge

(10) Patent No.: US 6,682,947 B1
(45) Date of Patent: Jan. 27, 2004

(54) FEED FORWARD TESTING

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/195,250

(22) Filed: Jul. 15, 2002

(51) Int. Cl.$^7$ .............................................. H01L 21/66
(52) U.S. Cl. ........................... 438/14; 438/15; 438/17; 716/4; 714/724
(58) Field of Search .............................. 438/14, 17, 15; 714/724, 725; 716/4, 5

(56) References Cited

U.S. PATENT DOCUMENTS 6,167,545 A * 12/2000 Statovici et al. ............. 714/724
6,496,418 B2 * 12/2002 Kawahara et al. ..... 365/185.24

* cited by examiner

*Primary Examiner*—Caridad Everhart
(74) *Attorney, Agent, or Firm*—Luedeka, Neely & Graham, PC

(57) ABSTRACT

A method of testing an integrated circuit. A first subset of test parameters is selected from a full set of test parameters designed to characterize given properties of the integrated circuit. A first subset of devices in the integrated circuit is tested with the first subset of test parameters, using different input levels to determine an acceptable low input level and an acceptable high input level for the first subset of test parameters on the first subset of devices. At least a second subset of devices in the integrated circuit is tested, where the second subset of devices is greater in number than the first subset of devices. The test is accomplished with at least a second subset of test parameters using the acceptable low input level and the acceptable high input level, to determine whether the integrated circuit functions properly at the acceptable low input level and the acceptable high input level. The integrated circuit is selectively binned based upon the determination of whether the integrated circuit functions properly at the acceptable low input level and the acceptable high input level.

20 Claims, 1 Drawing Sheet

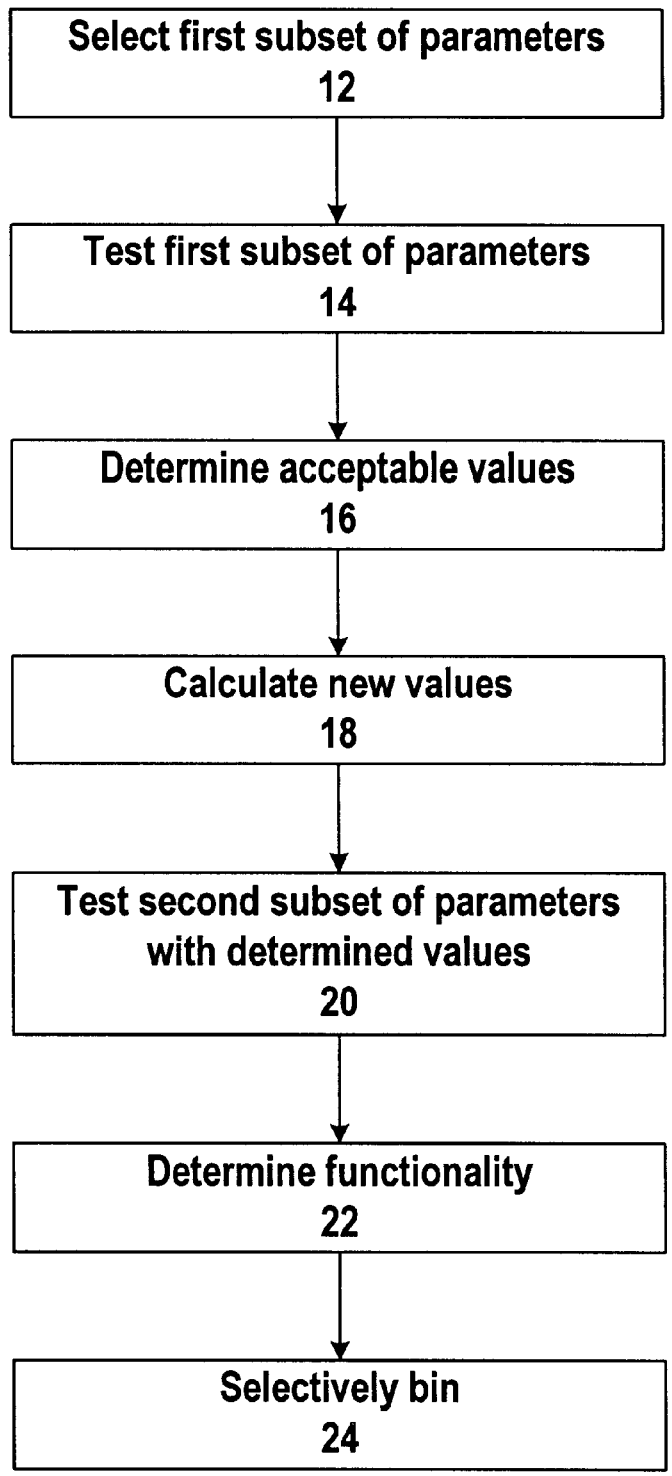

FEED FORWARD TESTING

FIELD

This invention relates to the field of integrated circuit fabrication. More particularly, this invention relates to electrically testing integrated circuits.

BACKGROUND

As the size of integrated circuits shrinks, the number of devices within an integrated circuit has risen. For example, a rule of thumb common called Moore's Law states that the number of transistors in a state of the art integrated circuit generally doubles every eighteen months. For many years this rule of thumb has generally been true. Thus, the increase in the number of cells within an integrated circuit has grown exponentially rather than linearly. Obviously, over the past several years the number of cells within a single integrated circuit has virtually exploded.

This tremendous and rapid increase in the number of active devices within an integrated circuit has come about as a result of innovation and changes in the way that the devices are designed and fabricated. Thus, many different issues have been overcome in accomplishing this increase in the capacity of integrated circuits. At the same time, however, this increase in the complexity and capacity of integrated circuits has created new challenges in regard to other aspects of integrated circuit fabrication, such as testing.

Integrated circuits typically receive a wide variety of testing throughout the fabrication process, both to ensure that the processes used to fabricate the integrated circuits are in control, and also to ensure that the structures formed by the various processes have the proper characteristics. Most of the tests performed during the fabrication process look at only an extremely narrow range of characteristics, which tend to be pertinent only to the step in the fabrication process that was most recently completed.

However, there are typically two different instances where a large battery of tests are performed on the integrated circuits, to ensure that the integrated circuit as a whole functions in the desired manner. The first of these comprehensive tests is performed at the end of front end processing, and is commonly called wafer sort. It is so called because the integrated circuits have been processed in wafer form up to this point in the fabrication process. The second of these tests is performed at the end of back end processing, and is commonly called final test. During back end processing the integrated circuits have been diced and packaged, and are then tested as completed devices.

Because integrated circuits have so many more active devices than in times past, the time required for wafer sort and final test, jointly and severally referred to as comprehensive testing herein, has likewise increased exponentially. Because this required length of time adds an unacceptable labor and equipment expense to the fabrication costs of the integrated circuits, there is continual pressure to discover and implement alternate procedures for testing the integrated circuits, which procedures are preferably less time consuming but at least adequately thorough.

Also, traditionally, most tests are performed as a pass/fail (or Boolean) test to set limits in the test program. There is a growing need for tests that measure the actual working range of the integrated circuit so that it can be determined if the integrated circuit is significantly different or an outlier to the intrinsic (defect free) population of all integrated circuits in the fabrication lot. This method of testing Is also becoming important to help identify circuits that contain subtle defects that do not fail the Boolean tests, but are likely to fail over time or in the customer application at temperature or at high speeds. Unfortunately, due to the growing gate count of integrated circuits and the growing cost of the test equipment, these types of tests can be cost prohibitive due to the test time required.

What is needed, therefore, is a test methodology by which an integrated circuit can be adequately tested within an amount of time that is less than that of prior art techniques.

SUMMARY

The above and other needs are met by a method of testing an integrated circuit. A first subset of test parameters, which may include vectors, is selected from a full set of test parameters designed to characterize given properties of the integrated circuit. A first subset of devices in the integrated circuit is tested with the first subset of test parameters, using different input levels to determine an acceptable low input level and an acceptable high input level for the first subset of test parameters on the first subset of devices. At least a second subset of devices in the integrated circuit is tested, where the second subset of devices is greater in number than the first subset of devices. The test is accomplished with at least a second subset of test parameters using the acceptable low input level and the acceptable high input level, to determine whether the integrated circuit functions properly at the acceptable low input level and the acceptable high input level. The integrated circuit is selectively binned based upon the determination of whether the integrated circuit functions properly at the acceptable low input level and the acceptable high input level.

In this manner, a first, qualifying test is performed on a limited number of devices within the integrated circuit, and with a limited number of test parameters. When the acceptable low and high input levels from this qualifying test are determined, a second more complete test is performed on the integrated circuit, to determine whether the integrated circuit functions properly at the acceptable low and high input levels from the qualifying test. Thus, a complete test to find the acceptable low and high input levels of every device or device group on the integrated circuit does not need to be completed for every test parameter. In this way, a great deal of time is saved during the testing process.

In a most preferred embodiment of the invention, the integrated circuit is tested for minimum VDD and maximum VDD by first selecting a first subset of test vectors from a full set of test vectors designed to characterize minimum VDD and maximum VDD of the integrated circuit. A first subset of devices in the integrated circuit is tested with the first subset of test vectors using different input voltage levels to determine a minimum VDD and a maximum VDD for the first subset of test vectors on the first subset of devices. A new minimum VDD is calculated by adding a first guard band value from the minimum VDD, and a new maximum VDD is calculated by subtracting a second guard band value to the maximum VDD. At least a second subset of devices in the integrated circuit is then tested, where the second subset of devices is greater in number than the first subset of devices, with at least a second subset of test vectors using the minimum VDD and the maximum VDD, to determine whether the integrated circuit functions properly at the minimum VDD and the maximum VDD. The integrated circuit is selectively binned based upon the determination of whether the integrated circuit functions properly at the minimum VDD and the maximum VDD.

In other preferred embodiments, a binary search of different input voltage levels is used to test the first subset of devices in the integrated circuit with the first subset of test vectors. The method is preferably accomplished at a maximum speed of the integrated circuit, but may alternately be accomplished at a nominal speed of the integrated circuit. The integrated circuit is preferably selectively binned by either scrapping or downgrading the integrated circuit based upon the determination of whether the integrated circuit functions properly at the minimum VDD and the maximum VDD.

BRIEF DESCRIPTION OF THE DRAWING

Further advantages of the invention are apparent by reference to the detailed description when considered in conjunction with the FIGURE, which is not to scale so as to more clearly show the details, wherein like reference numbers indicate like elements throughout the several views, and which depicts a flow chart for a method according to a preferred embodiment of the present invention.

DETAILED DESCRIPTION

With reference now to the FIGURE, there is depicted a flow chart for a method 10 according to a preferred embodiment of the present invention. The method 10 is first explained with a generalized presentation of the basic steps, which is then followed with a more specific example of how the basic steps are applied to a specific test. The first step of the method 10 is to select a first subset of test parameters for use in the first testing portion of the method 10, as given in block 12. As used herein, the term "parameters" includes the concept of elements such as test vectors. Although test vectors may not be strictly categorized as parameters in some usages of the term, it is understood that for the sake of convenience and so as to not make the description herein overly burdensome by continually referring to "parameters and vectors," that the term "parameters" as used herein includes the concept of test vectors. By indicating that a first subset is selected, there is the implication that there is a full set of test parameters from which the first subset is selected. Although the first subset could be the full set of test parameters, such an embodiment would tend to limit the benefits of the present invention to some degree. On the other hand, the selection of too small a first subset of parameters would tend to unduly limit the conclusions which could be drawn from the results of testing the first subset of parameters. Thus, in making the selection of the first subset of parameters, it is preferable to choose a subset size that balances various competing interests such as saving time with a smaller sample size, and increasing statistical significance with a larger sample size.

The full set of parameters, from which the first subset of parameters are selected, are designed to characterize given properties of the integrated circuits. Thus, the full set of parameters may include various tests or various modifications of a specific test that is used to determine one or more electrical or physical properties of an integrated circuit.

The first subset of test parameters is applied in a test environment to a first subset of devices in the integrated circuit, as given in block 14. Similar to that as described above, although the first subset of devices could be all of the devices, such an embodiment would tend to limit the benefits of the present invention to some degree. On the other hand, the selection of too small a first subset of devices may in some embodiments unduly limit the conclusions which could be drawn from the results of testing the first subset of devices. Thus, in making the selection of the first subset of devices, it is preferable to choose a subset size that balances various competing interests such as saving time with a smaller sample and increasing statistical significance with a larger sample.

The first subset of parameters are applied in the testing environment to the first subset of devices using different input levels to determine an acceptable low input level and an acceptable high input level, as given in block 16. Thus, it is understood that the parameters can be applied to the devices at different input levels, some of which are considered to be too low of an input level to be acceptable and others of which are considered to be too high of an input level to be acceptable. The decision as to what is acceptable is one that is made in light of the specific parameter and test that is applied to the device, such as exemplified in the more specific embodiment presented hereafter. The test can be performed at a variety of different speeds, such as an anticipated maximum speed, a nominal speed, a reduced speed, or a combination of such speeds.

When testing for a value such as a low or high acceptable input level, there are various means by which such a value can be determined. For example, the input level can first be set at a value that is known to be well below an anticipated low acceptable input level, and the test can be performed and the results analyzed. Then the input level can be incrementally raised by a predetermined amount, and the tests and analysis repeated. This can be iteratively conducted until the input value is first raised to a level where the acceptable low input level is determined, and then continued until the acceptable high input level is determined.

However, as one purpose of the present invention is to reduce the amount of time required to conduct such testing, the linear search method describe above is not the preferred method. Rather, a binary search method is preferably used. Binary search methods tend to work well with an ordered data set, such as input levels, and tend to dramatically reduce the number of iterations required to find a specific value, such as a low or high acceptable input level. Briefly, a binary search method jumps back and forth between two limits, cutting the spread between the two limits in half in each iteration, to quickly focus in on a value such as a minimum. As binary search methods are known in the art, a more complete description of such is not necessary herein, and is omitted for the purposes of focusing attention on other aspects of the invention.

Once the low and high acceptable input values are determined, there is an optional step of calculating new low and high acceptable input values, as given in block 18. In this optional step, the low and high acceptable input values are modified in some manner, such as to provide a safety or buffer zone to the results of the testing process. For example, a new acceptable low input value may be determined by adding a first guard band value from the acceptable low input level, and a new acceptable high input level may be determined by subtracting a second guard band value to the acceptable high input level. These new levels are then used in subsequent steps of the method in place of the original levels from which they were derived.

The first and second guard band values may be predetermined values, and may be equal, one to another. However, in a more preferred embodiment, the first guard band value is a percentage of the acceptable low input level, and the second guard band value is a percentage of the acceptable high input level. Again, these two percentages may be equal, one to another. For example, the first guard band value may be ten percent, which increases the acceptable low input level to a new acceptable low input level that is one hundred and ten percent of the original acceptable low input level. Similarly, the new acceptable high input level may be ninety percent of the original acceptable high input level, when the second guard band value is ten percent.

Once the low and high acceptable input levels have been determined, whether they be modified to the new input levels as described above or not, they are then used as the input levels with a second round of testing on at least a second subset of parameters and at least a second subset of devices, as given in block 20. Most preferably, the second subset of parameters is the full set of parameters, or alternately includes the first subset of parameters and some additional parameters. Most preferably the second subset of devices includes all of the devices in the integrated circuit.

Thus, it is evident at this point in time where the method of the present invention saves testing time. In the first round of testing, where the low and high acceptable input levels are determined, only a first subset of parameters and a first subset of devices are tested, so as to save time. As mentioned above, a search method such as a binary search can further save time during the first round of testing. Then during the second round of testing, all of the test parameters and all of the devices may be tested, but rather than independently determining the low and high acceptable input levels for each parameter and device, the integrated circuit is tested to determine whether the low and high acceptable input levels determined in the first round of testing are acceptable for the entire device. Thus, a tremendous amount of time is saved in this second round of testing. Even when the time required for both rounds is taken into account, it is much less than the time required for prior art methodologies. Again, the exact amount of time saved is dependent in part upon how large the subsamples of parameters and devices are in the first round of testing. Further time savings can be effected by using less than all the parameters on less than all the devices in the second round of testing.

During the testing, the integrated circuit is analyzed to determine whether it is functional at the determined input levels, as given in block 22. The integrated circuit is then selectively binned, as given in block 24, based at least in part upon whether the integrated circuit functions properly at the acceptable low input level and the acceptable high input level. For example, if the integrated circuit does function properly, then it is preferably passed for sale, and if it does not function properly, then it is binned such as for scrap or down grading.

By way of specific example, the method according to the present invention is particularly useful for testing minimum VDD and maximum VDD. In such an embodiment, a first subset of test vectors are applied to a first subset of devices, such as cells or blocks within the integrated circuit. The input voltage is then adjusted to determine the minimum VDD and the maximum VDD for those vectors on those devices. As mentioned above, a binary search method is preferably employed. Most preferably, a representative subset of vectors and devices is selected. Alternately, the selection may include the most critical vectors and devices.

Once the minimum VDD and the maximum VDD have been determined for the first subsets, the minimum VDD and the maximum VDD are used as input voltages for a more complete set of input vectors on a more complete set of devices. As mentioned above, the more complete sets may be all input vectors and all devices. In yet a further embodiment, the method can be hard coded into on chip test circuitry.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of testing an integrated circuit, the method comprising the steps of:

selecting a first subset of test parameters from a full set of test parameters designed to characterize given properties of the integrated circuit, testing a first subset of devices in the integrated circuit with the first subset of test parameters using different input levels to determine an acceptable low input level and an acceptable high input level for the first subset of test parameters on the first subset of devices, testing at least a second subset of devices in the integrated circuit, where the second subset of devices is greater in number than the first subset of devices, with at least a second subset of test parameters using the acceptable low input level and the acceptable high input level, to determine whether the integrated circuit functions properly at the acceptable low input level and the acceptable high input level, and selectively binning the integrated circuit based upon the determination of whether the integrated circuit functions properly at the acceptable low input level and the acceptable high input level.

2. The method of claim 1 wherein the step of testing at least a second subset of devices comprises testing the full set of test parameters.

3. The method of claim 1 wherein the step of selecting a first subset of test parameters from a fill set of test parameters designed to characterize given properties of the integrated circuit comprises selecting a first subset of test vectors from a fill set of test vectors designed to characterize minimum VDD and maximum VDD of the integrated circuit.

4. The method of claim 1 wherein the step of testing a first subset of devices in the integrated circuit with the first subset of test parameters using different input levels to determine an acceptable low input level and an acceptable high input level for the first subset of test parameters on the first subset of devices comprises testing a first subset of devices in the integrated circuit with the first subset of test parameters using different voltage levels to determine an acceptable minimum VDD and an acceptable maximum VDD for the first subset of test parameters on the first subset of devices.

5. The method of claim 1 wherein the step of testing a first subset of devices in the integrated circuit with the first subset of test parameters using different input levels comprises a binary search of different input levels.

6. The method of claim 1 wherein the method is accomplished at a nominal speed of the integrated circuit.

7. The method of claim 1 wherein the method is accomplished at a maximum speed of the integrated circuit.

8. The method of claim 1 further comprising an additional step between the steps of testing a first subset of devices in the integrated circuit and testing at least a second subset of devices in the integrated circuit, the additional step comprising calculating a new acceptable low input level by adding a first guard band value to the acceptable low input level, and calculating a new acceptable high input level by subtracting a second guard band value from the acceptable high input level.

9. The method of claim 1 wherein the step of selectively binning the integrated circuit comprises selectively one of scrapping and downgrading the integrated circuit based upon the determination of whether the integrated circuit functions properly at the acceptable low input level and the acceptable high input level.

10. A method of testing an integrated circuit, the method comprising the steps of:

selecting a first subset of test parameters from a full set of test parameters designed to characterize given properties of the integrated circuit, testing a first subset of devices in the integrated circuit with the first subset of test parameters using different input levels to determine an acceptable low input level and an acceptable high input level for the first subset of test parameters on the first subset of devices, calculating a new acceptable low input level by adding a first guard band value to the acceptable low input level, and calculating a new acceptable high input level by subtracting a second guard band value from the acceptable high input level testing at least a second subset of devices in the integrated circuit, where the second subset of devices is greater in number than the first subset of devices, with at least a second subset of test parameters using the acceptable low input level and the acceptable high input level, to determine whether the integrated circuit functions properly at the acceptable low input level and the acceptable high input level, and selectively binning the integrated circuit based upon the determination of whether the integrated circuit functions properly at the acceptable low input level and the acceptable high input level.

11. The method of claim 10 wherein the step of selecting a first subset of test parameters from a full set of test parameters designed to characterize given properties of the integrated circuit comprises selecting a first subset of test vectors from a full set of test vectors designed to characterize minimum VDD and maximum VDD of the integrated circuit.

12. The method of claim 10 wherein the step of testing a first subset of devices in the integrated circuit with the first subset of test parameters using different input levels to determine an acceptable low input level and an acceptable high input level for the first subset of test parameters on the first subset of devices comprises testing a first subset of devices in the integrated circuit with the first subset of test parameters using different voltage levels to determine an acceptable minimum VDD and an acceptable maximum VDD for the first subset of test parameters on the first subset of devices.

13. The method of claim 10 wherein the step of testing a first subset of devices in the integrated circuit with the first subset of test parameters using different input levels comprises a binary search of different input levels.

14. The method of claim 10 wherein the method is accomplished at a nominal speed of the integrated circuit.

15. The method of claim 10 wherein the method is accomplished at a maximum speed of the integrated circuit.

16. The method of claim 10 wherein the step of selectively binning the integrated circuit comprises selectively one of scrapping and downgrading the integrated circuit based upon the determination of whether the integrated circuit functions properly at the acceptable low input level and the acceptable high input level.

17. A method of testing an integrated circuit, the method comprising the steps of:

selecting a first subset of test vectors from a full set of test vectors designed to characterize minimum VDD and maximum VDD of the integrated circuit, testing a first subset of devices in the integrated circuit with the first subset of test vectors using different input voltage levels to determine a minimum VDD and a maximum VDD for the first subset of test vectors on the first subset of devices, calculating a new minimum VDD by adding a first guard band value to the minimum VDD, and calculating a new maximum VDD by subtracting a second guard band value from the maximum VDD, testing at least a second subset of devices in the integrated circuit, where the second subset of devices is greater in number than the first subset of devices, with at least a second subset of test vectors using the minimum VDD and the maximum VDD, to determine whether the integrated circuit functions properly at the minimum VDD and the maximum VDD, and selectively binning the integrated circuit based upon the determination of whether the integrated circuit functions properly at the minimum VDD and the maximum VDD.

18. The method of claim 17 wherein the step of testing a first subset of devices in the integrated circuit with the first subset of test vectors using different input voltage levels comprises a binary search of different input voltage levels.

19. The method of claim 17 wherein the method is accomplished at a maximum speed of the integrated circuit.

20. The method of claim 17 wherein the step of selectively binning the integrated circuit comprises selectively one of scrapping and downgrading the integrated circuit based upon the determination of whether the integrated circuit functions properly at the minimum VDD and the maximum VDD.

* * * * *